United States Patent [19]
DeHon et al.

[11] Patent Number: 5,742,180
[45] Date of Patent: Apr. 21, 1998

[54] DYNAMICALLY PROGRAMMABLE GATE ARRAY WITH MULTIPLE CONTEXTS

[75] Inventors: André DeHon, Cambridge; Thomas F. Knight, Jr., Belmont; Edward Tau, Boston; Michael Bolotski, Somerville; Ian Eslick, Cambridge; Derrick Chen, Cambridge; Jeremy Brown, Cambridge, all of Mass.

[73] Assignee: Massachusetts Institute of Technology, Cambridge, Mass.

[21] Appl. No.: 386,851

[22] Filed: Feb. 10, 1995

[51] Int. Cl.[6] ............................................. H03K 19/177
[52] U.S. Cl. .......................................... 326/40; 326/38
[58] Field of Search .............................. 326/38–40, 46

[56] References Cited

U.S. PATENT DOCUMENTS

| | | | |
|---|---|---|---|
| 4,336,601 | 6/1982 | Tanaka | 364/900 |
| 4,354,228 | 10/1982 | Moore et al. | 364/200 |
| 4,493,029 | 1/1985 | Thierbach | 364/200 |
| 4,594,661 | 6/1986 | Moore et al. | 364/200 |
| 4,700,187 | 10/1987 | Furtek | 340/825.83 |
| 4,748,585 | 5/1988 | Chiarulli et al. | 364/900 |
| 4,758,985 | 7/1988 | Carter | 326/40 |
| 4,771,285 | 9/1988 | Agrawal et al. | 340/825.83 |
| 4,791,602 | 12/1988 | Resnick | 364/900 |
| 4,870,302 | 9/1989 | Freeman . | |
| 4,879,688 | 11/1989 | Turner et al. | 365/201 |
| 4,918,440 | 4/1990 | Furtek | 340/825.83 |
| 4,969,121 | 11/1990 | Chan et al. | 364/900 |
| 4,992,933 | 2/1991 | Taylor | 364/200 |
| 5,019,736 | 5/1991 | Furtek . | |
| 5,027,315 | 6/1991 | Agrawal et al. | 364/900 |

(List continued on next page.)

OTHER PUBLICATIONS

Chen, D.C., et al., "A Reconfigurable Multiprocessor IC for Rapid Prototyping of Algorithmic-Specific High-Speed DSP Data Paths," *IEEE Journal of Solid-State Circuits*, 27(12):1895–1904 (Dec., 1992).

Denneau, M.M., "The Yorktown Simulation Engine," *IEEE 19th Design Automation Conference*, pp. 55–59 (1982).

Razdan, R., et al., "A High Performance Microarchitecture with Hardware–Programmable Functional Units," *Micro–27 Proceedings of the 27th Annual International Symposium on Microarchitecture*, San Jose, California, pp. 172–180 (Nov. 30–Dec. 2, 1994).

(List continued on next page.)

*Primary Examiner*—Edward P. Westin
*Assistant Examiner*—Jon Santamauro
*Attorney, Agent, or Firm*—Hamilton, Brook, Smith & Reynolds, P.C.

[57] ABSTRACT

An integrated dynamically programmable gate array comprises a two dimensional array of programmable gates. These gates can be implemented as look up tables but hardwired gates with programmable interconnections are also possible. Each one of the gates receives plural input logic signals from plural other gates. Consequently, a broad range of logic combinations are possible. The gates further include locally stored multiple contexts dictating different combinatorial logic operations performed by the gates. The contexts increase the logic operations performable by the gate and the fact that the contexts are locally stored enables better integration and speed. Only a context instruction needs to be distributed among programmable gates. A context signal generator is included that generates a context signal indicating a change in an active one of the contexts. This active context dictates the logic operations of the gates that commonly receive by the signal. Since the contexts information is stored on the gate array, and specifically locally, the context signal can change as fast as every clock cycle of the programmable gate array. To increase functionality, context memory arrays, which store context programming information, are separately addressable so that a new truth table is storable in a first one of the context memory arrays while a truth table of a second one of the context memory arrays is dictating the logic operations performed by the gates. As a result, the functionality of each programmable gate can be increased by increasing the number of available functions for that programmable gate.

28 Claims, 13 Drawing Sheets

U.S. PATENT DOCUMENTS

| | | | |
|---|---|---|---|
| 5,038,386 | 8/1991 | Li | 382/49 |
| 5,081,375 | 1/1992 | Pickett et al. | |
| 5,260,881 | 11/1993 | Agrawal et al. | 326/39 |
| 5,301,344 | 4/1994 | Kolchinsky | 395/800 |
| 5,315,178 | 5/1994 | Snider | |
| 5,336,950 | 8/1994 | Popli et al. | |
| 5,352,940 | 10/1994 | Watson | |
| 5,361,373 | 11/1994 | Gilson | 395/800 |
| 5,379,382 | 1/1995 | Work et al. | 395/275 |
| 5,414,377 | 5/1995 | Freidin | 326/40 |
| 5,426,378 | 6/1995 | Ong | 326/39 |
| 5,442,306 | 8/1995 | Woo | 326/40 |

OTHER PUBLICATIONS

Ling, X.P., "WASMII: A Data Driven Computer on a Virtual Hardware," *Keio University, Yokohama, Japan*, pp. 1–10. (Apr. 5–7, 1993), FCCM '93, Napa, CA.

Bhat, N.B., "Performance–Oriented Fully Routable Dynamic Architecture for a Field Programmable Logic Device," *Memorandum No. UCB/ERL M93/42, University of California, Berkeley* (Jun. 1, 1993).

DeHon, A., et al., "DPGA–Coupled Microprocessors: Commodity ICs for the Early 21st Century," *IEEE Workshop on FPGAs for Custom Computing Machines, Napa, CA* (Apr. 10–13, 1994). *For additional information regarding reference, see Information Disclosure Statement.

Bolotski, M., et al., "Unifying FPGAs and SIMD Arrays," *2nd International ACM/SIGDA Workshop on FPGAs, Berkeley, CA* (Feb. 13–15, 1994). *For information regarding reference, see Information Disclosure Statement.

Elliott, D.G., "Computational Ram: A Memory–SIMD Hybrid and its Application to DSP," *The Proceedings of the Custom Integrated Circuits Conference*, pp. 30.6 1–4 (May 3–6, 1992).

Jones, D, et al., "A Time–Multiplexed FPGA for Logic Emulation," *University of Toronto*, to appear in CICC, pp. 1–20 (May, 1995).

Lemoine, E., et al., "Run Time Reconfiguration of FPGA for Scanning Genomic DataBases," *IEEE Symposium on FPGAs for Custom Computing Machines, FCCM '95*, Napa, CA, (Apr. 19–Apr. 21, 1995).

Jones, C., et al., "Issues in Wireless Video Coding Using Run–Time–Reconfigurable FPGAs," *IEEE Symposium on FPGAs for Custom Computing Machines, FCCM '95*, Napa, CA, (Apr. 19–Apr. 21, 1995).

Li, J., et al., "Routability Improvement Using Dynamic Interconnect Architecture," *IEEE Symposium on FPGAs for Custom Computing Machines, FCCM '95*, Napa, CA, (Apr. 19–Apr. 21, 1995).

Hadley, J.D., et al., "Design Methodologies for Partially Reconfigured Systems," *IEEE Symposium on FPGAs for Custom Computing Machines, FCCM '95*, Napa, CA, (Apri. 19–Apr. 21, 1995).

Fried, J., et al., "NAP (No ALU Processor) The Great Communicator," *IEEE*, 2649(2):383–389 (1988).

Yeung, A.K., "A 2.4 GOPS Reconfigurable Data–Driven Multiprocessor IC for DSP," *Dept. of EECS, University of California, Berkeley*, pp. 1–14, (Feb. 14, 1995) ISSCC '95, pp. 108–109.

Hawley, D., "Advancd PLD Architectures," In FPGAs, W R Moore & W Luk (eds.) (UK: Abingdon EE&CS Books), pp. 11–23 (1991).

DYNAMICALLY PROGRAMMABLE GATE ARRAY WITH MULTIPLE CONTEXTS

GOVERNMENT SUPPORT

The invention described herein was supported in whole or in part by Grant Nos. N00014-91-5-1698 and DABT63-92-C0093 from the Advanced Research and Programs Administration (ARPA).

RELATED APPLICATIONS

This application is related to U.S. pat. appl. Ser. No. 08/388,230, entitled "DPGA-Coupled Microprocessors" filed on the same day as this application by the same inventors. This related application is incorporated herein by this reference.

BACKGROUND OF THE INVENTION

FPGA-based custom computing engines and massively parallel SIMD arrays have been demonstrated to provide supercomputer-class performance on some tasks at a tiny fraction of a supercomputer's cost. Both of these architectures consist of arrays of small yet numerous processing elements. Because most of the silicon in the FPGA and SIMD chips is actively operating on data bits, the yield is surprisingly high performance. SIMD machines achieve high utilization by massive data parallelism. FPGA machines achieve high utilization by task-specific hardware configuration and pipelining. In both cases, several thousand bits are transformed per cycle, compared to the 64 bits of a typical microprocessor.

Field-Programmable Gate Arrays (FPGAS) are widely used today to implement general-purpose logic. FPGAs are built from a moderately fine-grained array of primitive logic functions. An FPGA array is customized by selecting the logical function which each logic array element (AE), usually programmable gates, performs and the interconnection pattern between AEs. Using multiple stages of logic and primitive state elements, these arrays are programmed to implement both sequential and combinational general-purpose logic. FPGAs are in wide use today for system customization and glue logic, low-volume application-specific designs, and IC prototyping. A variety of FPGAs are commercially available from a number of vendors, e.g. Xilinx, Actel, Atmel, Lattice.

Single-Instruction Multiple-Data (SIMD) arrays are employed to realize high throughput on many regular, computational intensive data processing applications. An array of simple, fine-grained AE's, usually arithmetic logic units (ALU), make up most SIMD arrays. Typically, the AE's are wired together through local, nearest-neighbor communications. On each clock cycle, an instruction is broadcast to all AEs, and each AE performs the indicated computation on its local data element. SIMD arrays are commonly used for algorithms requiring regular, data-parallel computations where identical operations must be performed on a large set of data. Typical applications for SIMD arrays include low-level vision and image processing, discrete particle simulation, database searches, and genetic sequence matching. NASA's MPP, Thinking Machines' CM-2, and MasPar's MP-1 are early examples of large-scale SIMD arrays. Increased silicon area along with advanced packaging trends allow production of very high-performance, highly-integrated, SIMD arrays at reasonable costs.

The computational array of both an FPGA and a SIMD is composed from a regular lattice of AEs along with interconnection resources linking AEs together. Abstractly, each AE performs a simple computation on its inputs to produce one or more output bits. These inputs come from local states, characteristically in SIMD's, or via communication channels from other AEs, in the case of FPGA's. The outputs are either stored to the local state or are communicated to other AEs. An instruction is used to specify the computation performed by each AE. Instructions are typically also used to specify communication and state manipulation.

SUMMARY OF THE INVENTION

In the most general setting, it would be desirable to specify a different instruction for each AE on each computational cycle. Unfortunately, in such an array, the resources required for instruction distribution dominate the array geometry and the required instruction bandwidth is unmanageably large. In practice, the manageable instruction bandwidth limits the operation rate of the array. With a P-element array where each element implements $N_f$ distinct functions, Equation 1 shows the relation between computational cycle time $t_{cycle}$, and instruction bandwidth, $I_{BW}$.

$$I_{BW} = \frac{P \cdot \log_2(N_f)}{t_{cycle}} \qquad (1)$$

For example, a 100 element array with 64-function elements operating at 10 MHZ, requires $100\log_2(64)/100$ ns=6 Gbits/sec. For an instruction distribution bandwidth of 1 Gbit/s, the clock cycle for the array must be limited to $100\log_2(64)/10^9$=600 ns.

FPGA and SIMD arrays both weaken this general computational model to avoid the requirement for huge instruction bandwidth. By simplifying the model, each type of array achieves a more pragmatic balance of resource requirements. For certain classes of applications these simplified models are adequate and can be engineered to take full advantage of the implementation technologies available.

FPGAs weaken the model by eliminating the instruction. Consequently, each programmable gate's operation does not change through time. Different gates, however, can be executing different operations. During a slow programming phase, each gate is configured with its new operation, which remains fixed during subsequent normal operation. In SRAM programmable FPGAs, e.g. Xilinx LCA, Atmel, this programming phase normally occurs once each time the system is powered on. In fuse or anti-fuse based FPGAs, e.g., Actel, Quicklogic, a device is programmed exactly once during its lifetime.

SIMD arrays weaken the model by distributing the same instruction to every ALU. Each ALU is allowed to perform a different operation on each computational cycle, but all the unit's in the array are required to perform the same operation during any given cycle.

These two compromises weaken the model along orthogonal dimensions. FPGAs compromise in the rate of instruction dispatch to allow the instructions to vary spatially through the array. SIMD arrays compromise in the spatial variation of instructions to allow a high rate of instruction dispatch.

Conventional FPGA arrays, however, are sub-optimally utilized. A particular programmable gate is only used once in any given logic calculation. Consequently, it is relevant only during the time required to logically combine the respective input signals to generate the combinational output signal. This time is small compared to the emulation clock period, for example, in which all the logic operations of the FPGA must finish.

The present invention is based upon the realization that the silicon real-estate associated with storing the gate logic functions is actually quite small in comparison to the total real-estate the gate consumes. As a result, the functionality of each programmable gate can be increased by increasing the number of available functions for that programmable gate without seriously impacting the overall size. This dovetails neatly with the sub-utilization of conventional arrays. By allowing contexts to be switched within a clock cycle, for example, the effective power of a gate array can be doubled, or more, with only small increases in the size of that device. These changes enable the present invention to more closely approximate the paradigm of a new AE instruction on every computational cycle.

At the elemental level, the present invention is directed to an architecture that can be viewed as a hybrid FPGA-SIMD, combining features from each one. Like FPGA's, each array element, preferably a programmable gate such as a look-up table (LUT) but possibly an arithmetic or other type of logic unit, can be individually programmed. But, like SIMD's, the AE's have different instructions that are enabled in response to globally broadcast instructions.

The broadcast instruction is a context identifier (CID). Locally, each logic element performs one of a number of locally-stored logic operations as dictated by the CID. There is no requirement, however, that these locally stored operations be the same between logic elements, each holds a distinct array of selectable operations. As a result, the CID can change on every cycle; the local storage of multiple logic functions in each AE enables fast switching without the reloading or transferring of context programming information.

At the interconnect level, the present invention also includes routing resources that are also configurable in response to the context. The logic value of the CID determines interconnect routing between the logic elements, the distribution of input signals to the gate array, and pin assignments of gate array output signals.

For maximum flexibility, new operation data is writable in the invention by proper co-ordination of CID stream. The array updates some context operation programming while the AE's simultaneously access other context programming for the logic computations. The AE instruction store can be analogized to a context cache, the writable instruction allows high speed cache replacement.

In general, according to one aspect, the invention features an integrated dynamically programmable logic array. This device comprises at least a two dimensional array of programmable logic elements. In specific embodiments, these logic elements can be implemented as ALU's or programmable gates such as look up tables or hardwired gates on the planar substrate. Also, the array the could be extended in the third dimension by combining and cross-linking additional substrates. Each one of the logic elements receives plural input logic signals from plural other logic elements. Consequently, a broad range of logical combinations are possible. The logic elements further include locally stored multiple contexts dictating different combinatorial logic operations performed by the logic elements. The contexts increase the logic operations performable by the logic element and the fact that the contexts are locally stored enables better integration and speed. Only a context instruction needs to be distributed among the programmable logic elements to switch between logic functions of inventive logic array.

In specific embodiments, a context signal generator is included that generates a context signal to indicate the active one of the contexts. This active context dictates the logic operations of the logic elements that commonly receive the signal. Since the context information is stored on the logic array, and specifically stored locally by integration through the array, the context signal can change as fast as every clock cycle of the programmable logic array.

To increase functionality, context memory vectors, which store context programming information, are separately addressable so that a new truth table is storable in a first one of the context memory vectors while a truth table of a second one of the context memory vectors is dictating the logic operations performed by the gates.

Versatility is further augmented by providing an interconnect, preferably hierarchial, multiplexer based or crossbar-type, that includes stored multiple contexts. At this level, the contexts dictate routing of the logic signals between the elements.

In a further vein, the logic elements are adaptable to enable transmission of logic signals directly between logic elements, without intervening latching. This characteristic in generally descriptive of FPGA-type logic arrays in which combinational signals propagate continuously between gates or logic elements during clock cycles. This feature enables more rich combination logic simulations while increasing computation speed. Each signal propagates through the array at its own speed. In contradistinction, SIMD-type systems generally latch at the output of each ALU-type logic element, then usually recirculate the combinational signal back through the same or subsequent ALU for the next computation cycle. This quality generally limits the applicability of SIMD's to register-based arithmetic computational operations.

In general, according to another aspect, the invention features an integrated dynamically programmable logic array. This array comprises a two dimensional array of programmable logic elements, the logic elements receiving input logic signals from other logic elements, also from off-chip, or from on-chip logic outside of the array. In specific embodiments, these logic elements can be ALUs, programmable gates, fusible logic structures, or other configurable elements. A shared routing network transmits the logic signals between logic elements. That is, interconnect resources are shared and alternately utilized by different logic elements. This interconnect stores multiple contexts each dictating different routing patterns of the logic signals between the logic elements. As a result, routing patterns can change quickly upon signaling a context change.

In specific embodiments, the shared routing network comprises a plurality of crossbars linking sub-arrays of the logic elements. These crossbars comprise context memories for storing routing information corresponding to each one of the contexts. Preferably, the context memories are local to the respective crossbars.

In general, according to still another aspect, the invention features a method for operating an integrated dynamically programmable gate array. The method is relevant to gate arrays that include a two dimensional array of programmable gates. The method comprises providing each one of the gates with plural input logic signals from plural other gates. Multiple contexts are also locally stored at the gates. Different combinatorial logic operations can then be performed with the gates by accessing the multiple contexts.

In specific embodiments, the method also includes generating a context signal indicating a change in an active one of the contexts. This active context dictates the logic operation of the gates. Further, the signal is commonly provided to the programmable gates of the array.

In general, according to a further aspect, the invention features a method of operating an integrated dynamically programmable gate array including a two dimensional array of programmable logic elements and a shared routing network. This method comprises storing multiple contexts, each context dictating different routing patterns of the routing network. Then, combinational logic signals are generated in the logic elements in response to logic signals from other elements. To complete calculations, the contexts of the network are changed to execute different routing patterns of the logic signals between the logic elements.

The above and other features of the invention including various novel details of construction and combinations of parts, and other advantages, will now be more particularly described with reference to the accompanying drawings and pointed out in the claims. It will be understood that the particular method and device embodying the invention is shown by way of illustration and not as a limitation of the invention. The principles and features of this invention may be employed in various and numerous embodiments without the departing from the scope of the invention.

BRIEF DESCRIPTION OF THE DRAWINGS

In the accompanying drawings, reference characters refer to the same parts throughout the different views. The drawings are not necessarily to scale; emphasis has instead been placed upon illustrating the principles of the invention. Of the drawings.

DETAILED DESCRIPTION OF THE PREFERRED EMBODIMENTS

By reference to the accompanying drawings, the preferred embodiments of the present invention are described hereinbelow. The particular dynamically programmable gate array illustrated incorporates the principles of the instant invention in both connectivity between AE's—interconnect, see FIGS. 1 and 2A—and the primitive programmable gates—the look up table, see FIG. 2a. While each is capable of standing on its own, they are preferably implemented together in the same device. The discussion will begin at the device scale for perspective and quickly descend to the AE, thereafter slowly increasing in scale.

Figure 1:
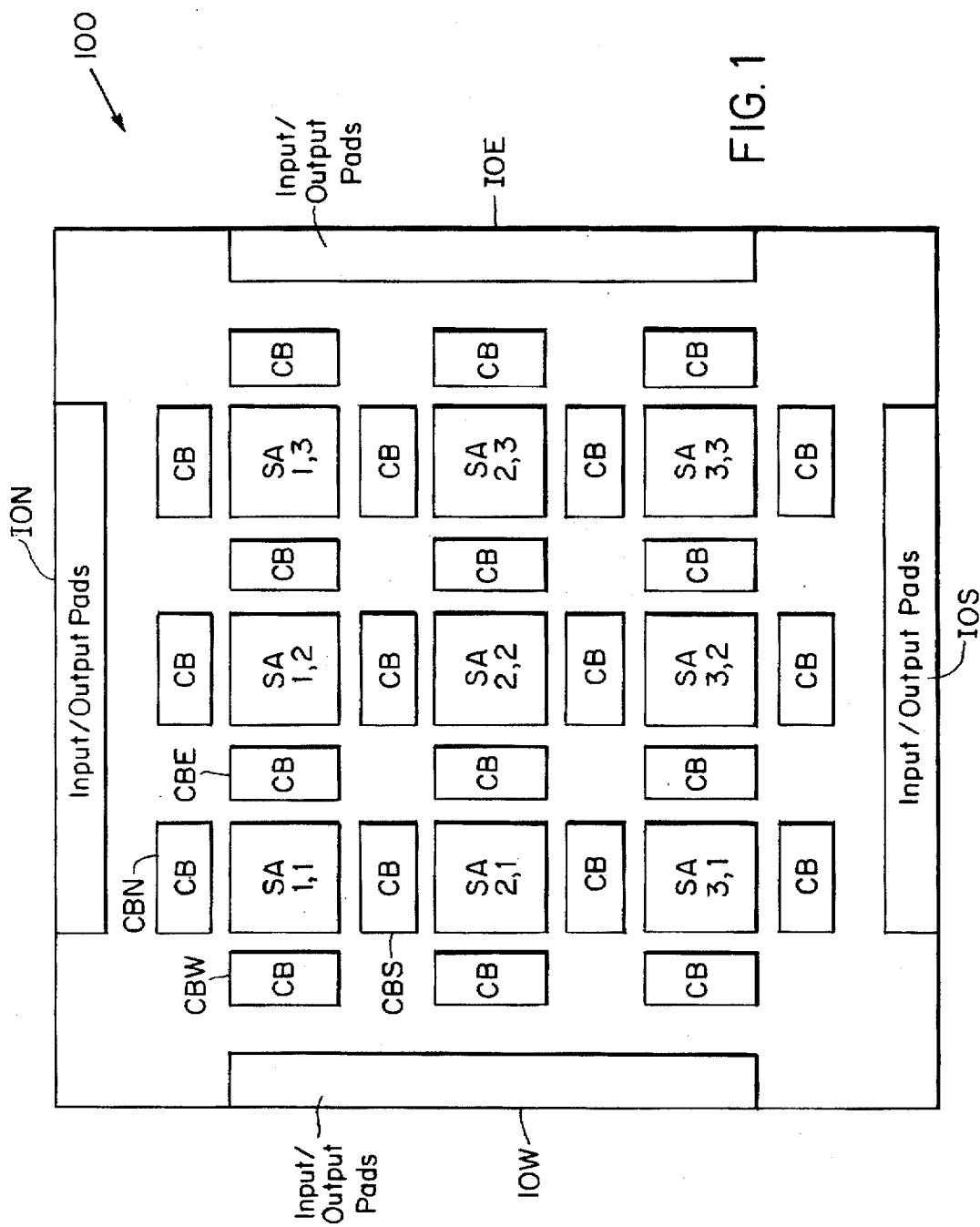
FIG. 1 is a block diagram of the dynamically programmable gate array (DPGA) 100 of the present invention showing the organization of the subarrays SA of array elements and the crossbars CB of the interconnect.

FIG. 1 illustrates a dynamically programmable gate array (DPGA) 100 constructed according to the principles of the present invention. Its architecture is organized into three logic block hierarchies. The core feature of the DPGA is a simple look up table backed by a multi-context memory block that stores the logic operations of the programmable gates (not shown in this view). Sixteen (4×4) AE's including the programmable gates are arranged into each subarrays SA1,1–SA2,2 with dense programmable local interconnects. At the chip level, nine (3×3) subarrays are connected by associated bidirectional crossbars CBN, CBE, CBW, CBS. Communication at the edge of the nine subarrays goes off-chip via input/output pads or pins ION, IOE, IOW, IOS.

Figure 2A:
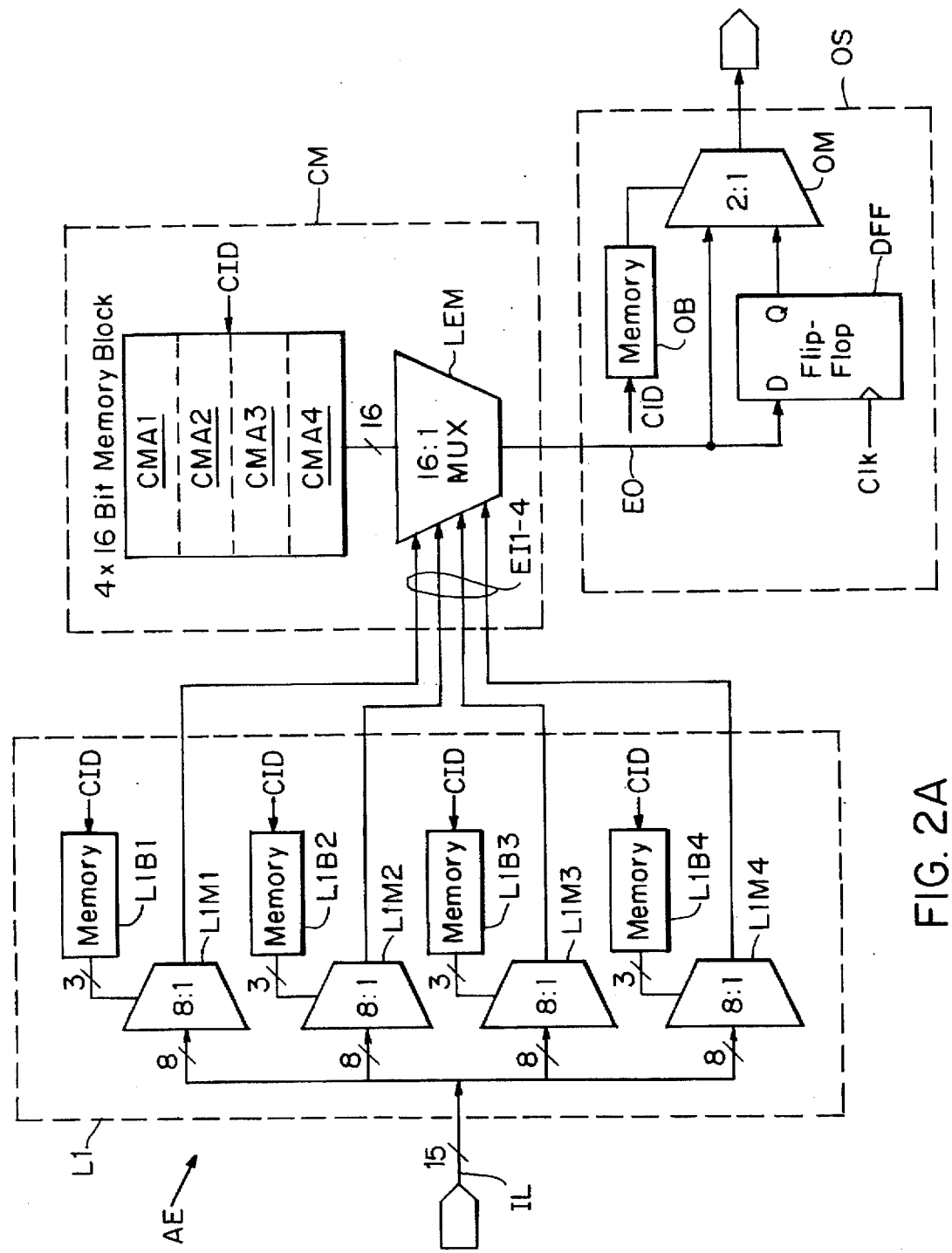
FIG. 2A is a simplified block diagram of an array element (AE) showing the level-one interconnect L1, the look up table CM, and the output selector OS.

FIG. 2A is a block diagram of array element (AE), which is the fundamental building block of the DPGA logic architecture. A symmetrical array architecture exploits the simplicity of a single AE and replicates it into functional, homogeneous logic blocks.

Generally, the AE comprises a level-one interconnect L1 that selects element input signals EI1–4 from fifteen possible interconnect lines IL. Briefly, these fifteen lines comprise one self interconnect, i.e., a feedback from the output of the AE, six local interconnects that represent the outputs of the six other AE's that occupy either the same row or same column as the self AE in the subarray, and eight global interconnects that reach the AE through the adjoining crossbars servicing the AE's subarray.

More specifically, the level-one interconnect L1 comprises four, 8:1, multiplexers L1M1–4, each selecting among eight interconnect lines. Each multiplexer is provided with a different subset of the fifteen interconnect lines so that the selected element input signals EI1–4 can represent a broad spectrum of logic combinations of the fifteen signals available to the AE.

A 4 context×3 bit memory L1B1–4 is associated with each multiplexer and locally placed in the AE. These memories L1B1–4 provide a context dependent selection signal to the associated level-one multiplexer. To provide this function, the memories L1B1–4 each comprise four context memory vectors that are individually enabled by the CID. The three bits of the enabled context memory vector completely define the level one multiplexer operation. Thus, the level-one interconnect L1 locally stores routing configurations corresponding to each context, allowing routing changes on a context-to-context basis, and as fast as every clock cycle.

The second principle element of the replicated AE is the programmable gate, which is implemented here as look up table CM. The look up table CM is programmed with four truth tables of the four logic operations to be performed by the AE in the four contexts. The element input signals EI1–4 and a context identifier CID address the look up table CM to generate the appropriate output signal stored at the addressed location.

An N-input look up table can emulate any N-input logic gate, at the cost of storing $2^N$ entries in memory. Given the tradeoffs between speed, area, and granularity of the functionalities on an integrated level, a 4-input look up table is adopted to achieve an overall balance. Besides programmable gates such as look up tables or hardwired gate arrays, other logic elements are possible. These include arithmetic logic units (ALU) for example. Generally, an ALU's range of possible operations is less and limited generally to arithmetic functions, such as addition, subtraction, and multiplication. This suggests the programmable gate is the preferable implementation and specifically look up tables.

The look up table CM comprises a 4 context×16 bit logic operation memory LOP comprising context memory vectors CMA1–4. These vectors are selectively enabled by the context identifier CID. The 16:1 multiplexer LEM accesses the enabled memory vector on the basis of the element input signals EI1–4 to retrieve the logic value corresponding to the desired logic operation. Thus, any 4 input×1 output logic operation is emulated.

An output selector OS receives the output signal EO from the look up table CM and latches it to alternatively provide either the current output of the look up table or the most recent output, the output on the last clock period. In more detail, the output selector OS latches the element output signal EO in an edge-triggered flip flop DFF in response to the clock signal CLK. The element output signal and the delayed element output signal are then presented to a 2:1 output multiplexer OM. An output select memory OB, 4 context×1 bits, drives this multiplexer OM to select either the element output signal or the delayed element output signal as a function of the context.

The output selector is particularly useful when computations require the execution of multiple contexts due to their complexity. During the initial context, input signals propagate through the array from the DPGA 100 inputs and subsequent combinational signals propagate from one AE output to the next AE continuously without any latching. On the clock signal and the change to the next context, the resulting logic values are latched in the flip-flops DFF of the last AE's in the computation. These logic values then form the initial values for the computations of the next context. Specifically, when the context changes on the next clock cycle, the multiplexers are controlled to select the output Q of the flip-flop DFF, rather then the multiplexers LEM. Thus, the logic values resulting from cascaded AE's are preserved into the next context by properly compiling the context information of the output memory OB.

Figure 2B:
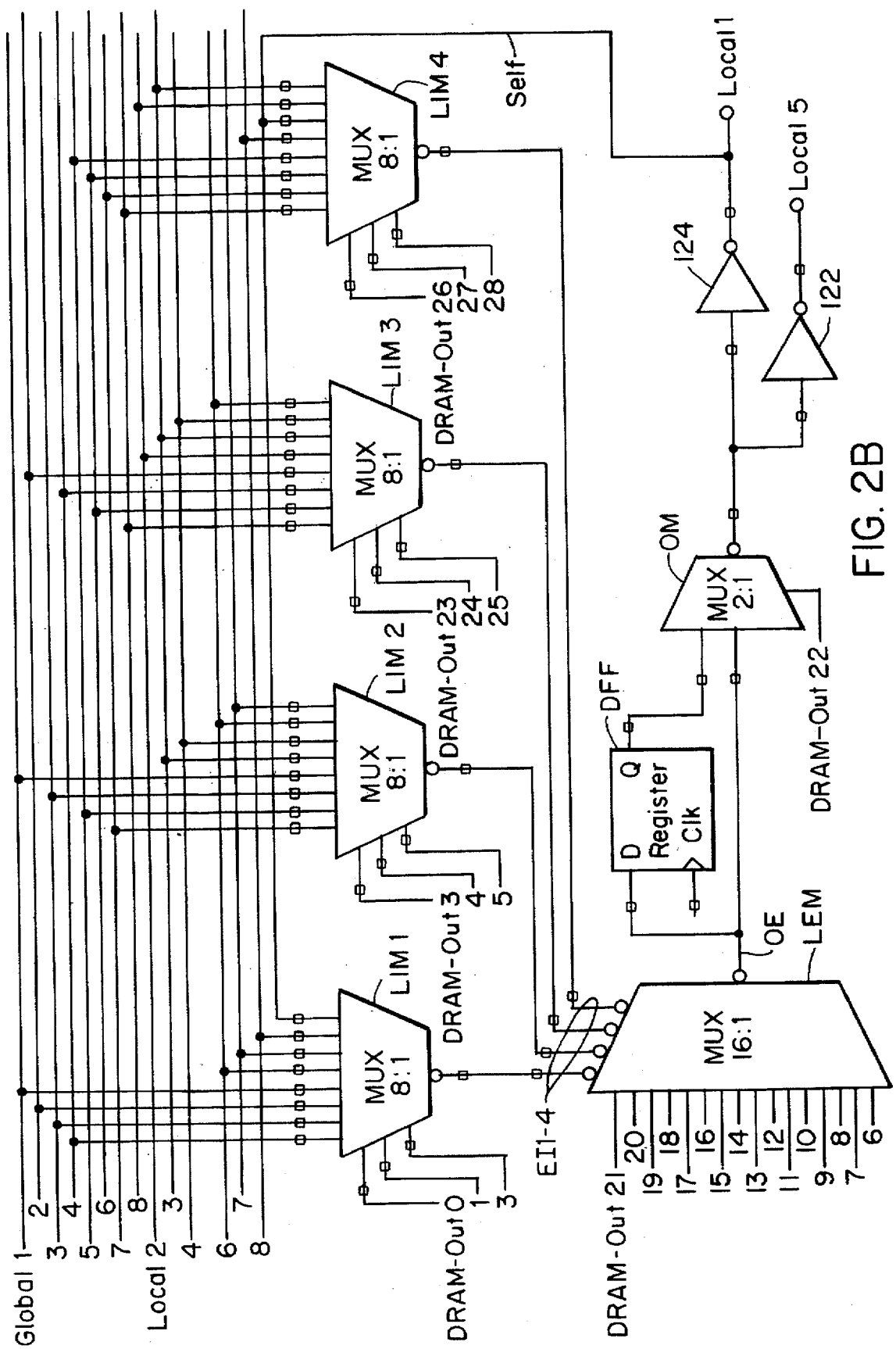
FIG. 2B is a schematic of the AE showing the details of the level-one interconnect without the memory block.

FIG. 2B is a less schematic illustration of the level-one interconnect and multiplexer arrangement of the AE. Specifically, global interconnect lines global 1–8, local lines 2–4, 6–8 and a self signal are provided in various combinations to each of the level-one multiplexers L1M1–4. DRAM output signals 1–5 and 23–28 are provided as selection signals to each of these multiplexers. The selected element input signals EI1–4 are received by the logic element multiplexer LEM as select signals. This 16:1 multiplexer LEM then provides one of the DRAM output signals 6–21. The selected element output signal is latched to the delay flip flop DFF and received at the 2:1 output multiplexer OM. A column driver 122 broadcasts the signal over the column local interconnect line, and a row driver 124 drives the row local interconnect line of the AE.

The AE makes use of three different types of multiplexer: one 16-to-1 for the look up table, four 8-1 for the input fan-in selector, and one 2-1 for an optional latched output. Two implementations of multiplexers are probable: one is a CMOS full-switch implementation using both NMOS and PMOS gates and the other is a pass-gate implementation using exclusively NMOS gates. The two implementations offer different tradeoffs in power consumption, area, and performance. The design decision, by convention, favors area and performance most.

The pass-gate implementation is more area efficient, requiring less than at most half of the area as the full-switch. However, a high pass-gate output signal does not reach a full $V_{dd}$, degraded from 5.0V to 3.5V. This degraded voltage raises issues of static power dissipation when a buffer is used to restore the full $V_{dd}$. One way to improve the degraded output high is to add a feedback P-device from the output. This will assist the pull-up to a higher voltage and mitigate static power dissipation. The negative trade-off of the feedback is a slower output, resulting from a longer transition period between valid putouts due to voltage fight between transitive gates. Calculation shows that static power being dissipated is negligible. Therefore, it does not warrant the slower feedback implementation.

The full-switch implementation requires a paired PMOS gate for every NMOS gate to restore voltage by assisting pull-up. The cost of implementing PMOS gates is high in terms of layout, however. In addition to the double transistor count, full-switch requires P-devices and N-wells that add tremendous design rule constraints when doing layout. If equal rise and fall times are desired, the P-devices sizings have to more than double those of N-devices. This would effectively more than triple the gate area required by the pass-gate implementation. Even though full-switch provides a wider channel to reduce the resistance in the single path, the effect on speed by the added capacitance of P-device is greater than that of the reduction of resistance. The use of full-switch implementation will prove to be profitable only when the load capacitance is large.

Figure 2C:
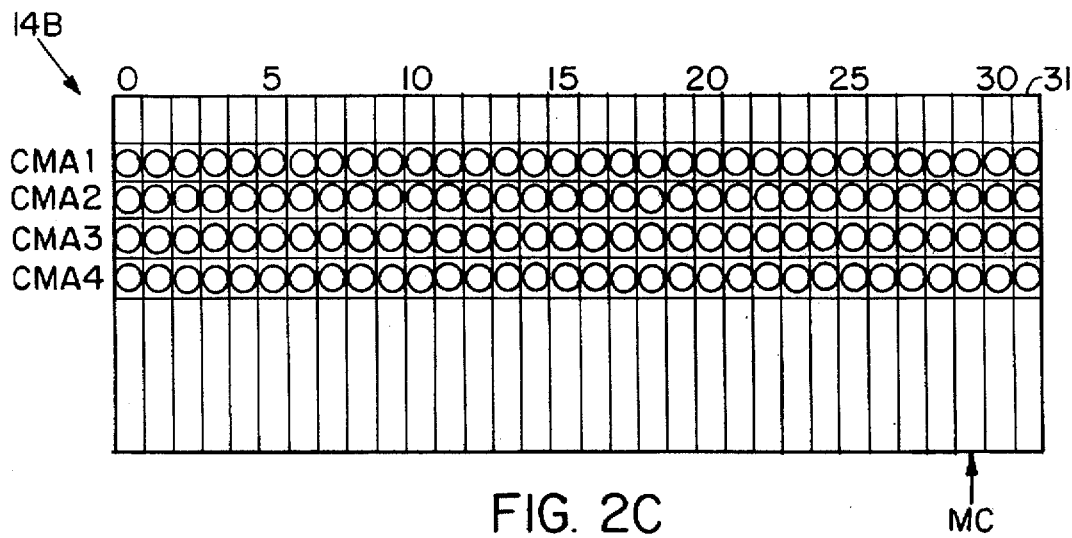
FIG. 2C schematically shows the 4-context by 32 column memory block MB of an AE.

FIG. 2C schematically shows a 32 column by 4 context memory block MB. As suggested by FIG. 2B, each of the level-one memory L1M1–4, the logic operation memory LOP, and the output memory block OB are actually implemented as a single 32-column memory block MB. This memory block comprises four rows corresponding to each of the context memory vectors CMA 1–4. Each of these rows is 32 bits wide.

Figure 2D:
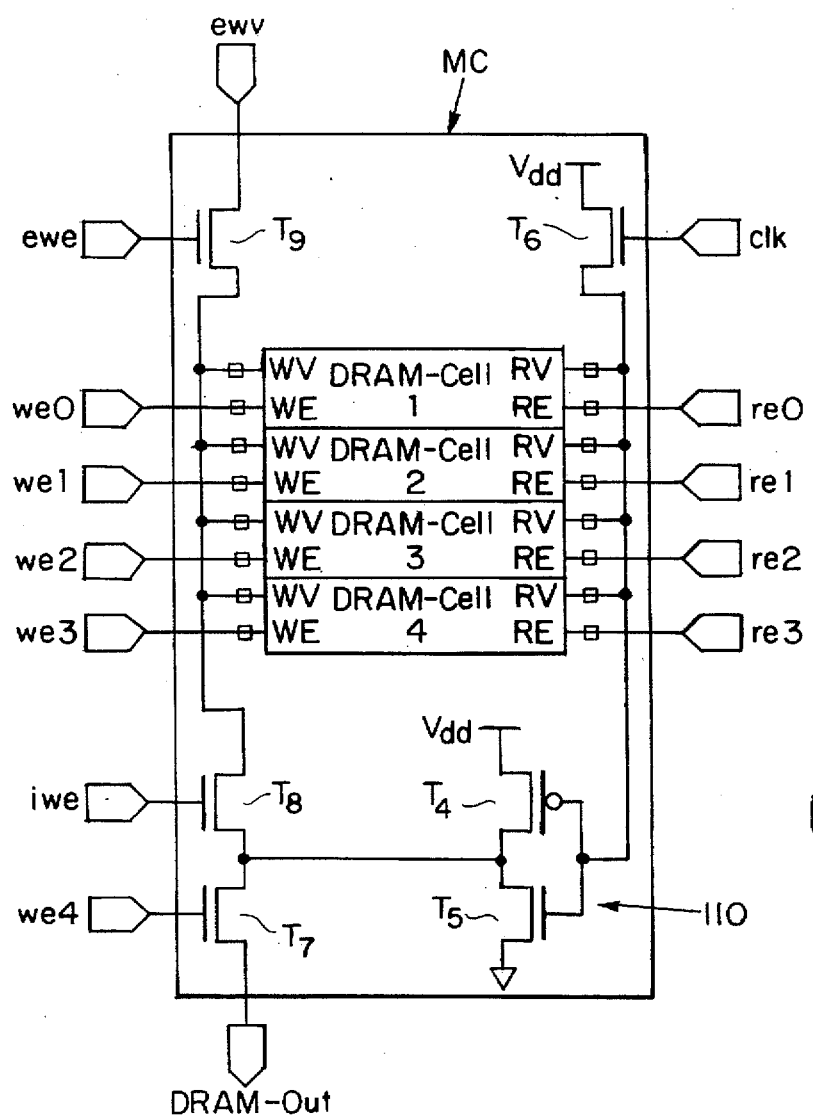
FIG. 2D shows an exemplary 4-bit memory column MC extracted from the memory block MB of FIG. 2C.

FIG. 2D shows an exemplary 4-bit column MC extracted from the 32 column memory block shown MB in FIG. 2C. Here, four DRAM cells 1–4 are separately addressable by read enable signals re0–3. The read value provided at DRAM cell ports RV is amplified by a pull-up/pull-down output driver and refresh inverter 110. Write enable lines we0–3 separately address the DRAM cells. The logic value stored in each DRAM cell is received at the write value ports WV under control of the write enable we0–3 and the enable write enable signal ewe.

The separate write enable, write value, read enable and read value lines effectively make the memory block a two-port memory allowing simultaneous reads and writes. Consequently, context data can be read from one of the DRAM cells, DRAM cell 1, for example, while a new context data is written to one of the other three DRAM cells 2-4. In the actual implementation, however, read/write operations of the memory is divided into two stages of system's single-phase clock. The read operation takes place in the first half of the clock cycle while the write operation takes place in the latter half. When the clock goes high, the read line charges to $V_{dd}$. The cell's memory read port is enabled during a read operation.

Figure 2F:
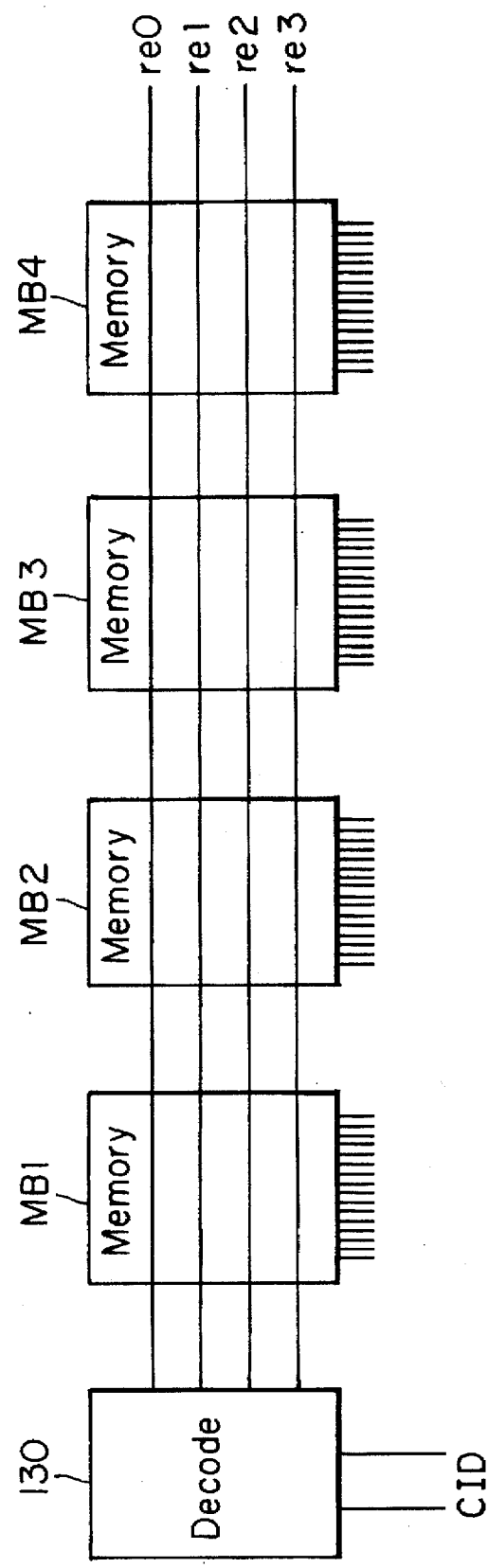
FIG. 2F is a block diagram illustrating four memory blocks MB of separate AE's sharing a single decoder 130.
Figure 2E:
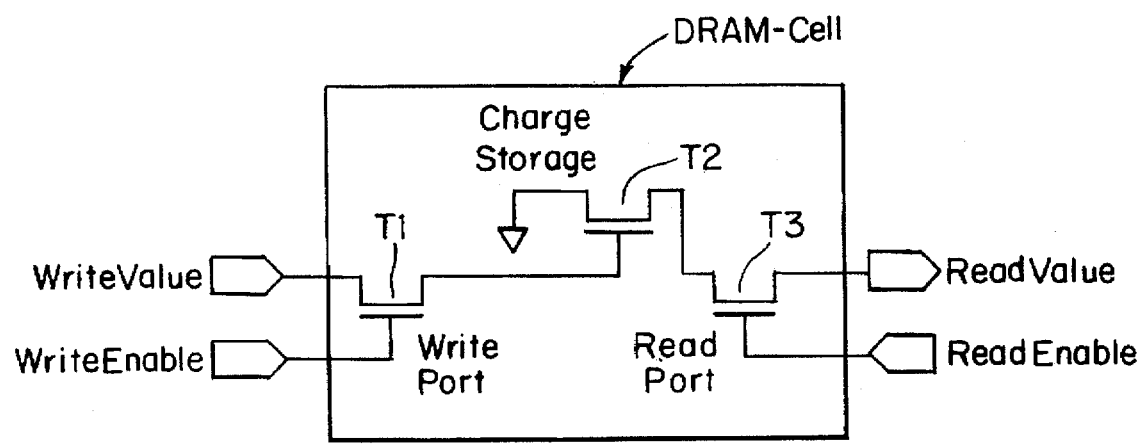
FIG. 2E shows a three transistor DRAM cell extracted from the 4-bit memory column of FIG. 2D.

FIG. 2E shows an exemplary DRAM cell from the memory column shown in FIG. 2D. This is an aggressive 3-transistor implementation in which transistor T3 functions as a read port, T1 a write port, and T2 a storage device to store a binary bit by gate capacitance. While this DRAM cell can alternatively be a static RAM (SRAM) or even a fusible write-once implementation, the three transistor DRAM cell is space efficient while being programmable.

When a logical high is stored on the gate capacitance of the pull-down device T2. This pull-down device will turn on and fight with the pull-up device T4 of driver 110, attempting to charge the read value line.

On the latter half of the clock cycle, both the charge device T6 and the read port of the DRAM cell are disabled. The read line, with all gate and parasitic capacitances associated to it, retains the same value from previous half of the cycle. This value controls the output of the refresh inverter 110 which can selectively drive either the programming lines by enabling the IWE and EWE signals, or drive out by enabling the WE4 signal received by T7. Enabling the IWE and any of WE0-3 signals will cause the refresh inverter 110 to write a new value into that memory cell.

Pull-up devices are typically implemented using P-devices. However, in order to maximize the utilization of silicon area, N-device T6 is used instead for charging the memory column. The tradeoff of doing so is that the read line is only pulled up to a maximum of one threshold drop below the power rail, $V_{dd}-V_{TH}$. In such case, the voltage is approximately 3.5V. The 3.5 V input, though a legal high as according to the inverter 110, does cause the P-device of the inverter to not properly turn off. The undesirable consequence is a fight of the two devices. Two factors in the design of the inverter assure that the NMOS transistor will prevail in this fight. First, the N-device turns on with 3.5V, versus the 1.5V of the P-device. Second, the NMOS transistor is sized identically to the PMOS. Because the N-device has greater mobility of electrons that the P-device, the former's relative strength is about 2½ times stronger than that of the latter, and will prevail to pull the output line low.

Referring to FIG. 2F, the read enable signals re0-3 are generated from the CID by a decoder 130. In an actual implementation, the read enable lines are distributed to multiple 32 column memory blocks, MB1-4. Specifically, a single local context identifier decoder 130 is allocated for each group of four AE's. The memory blocks MB1-4 of those AE's are physically aligned so that common read enable lines re0-3 from the decoder can control the memory blocks MB1-4 in common. This decreases the real-estate required for the CID decoding.

Figure 3A:
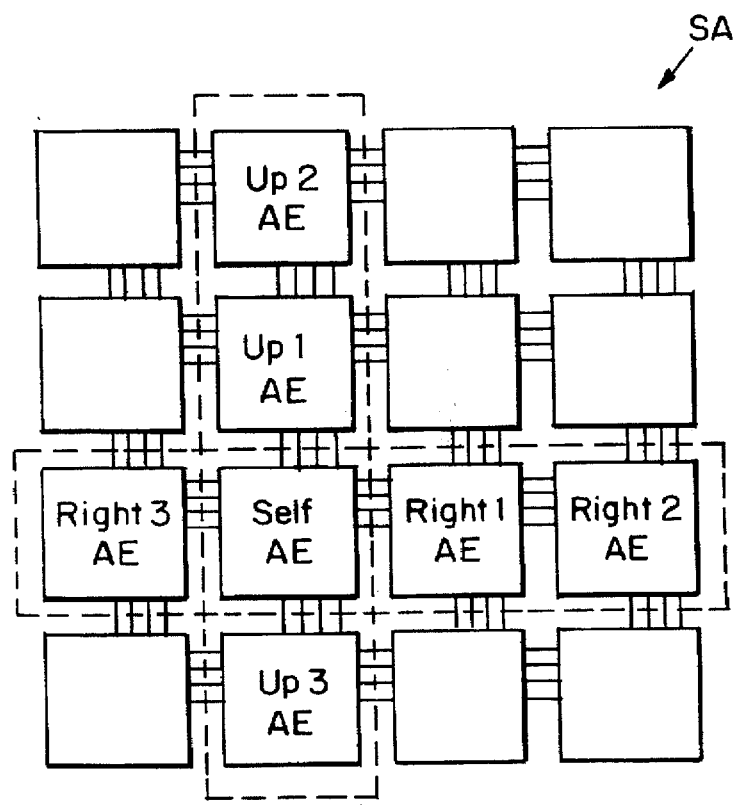
FIG. 3A is a block diagram showing the level-one interconnect for distributing local inputs between AE's of an exemplary subarray SA.
Figure 3B:
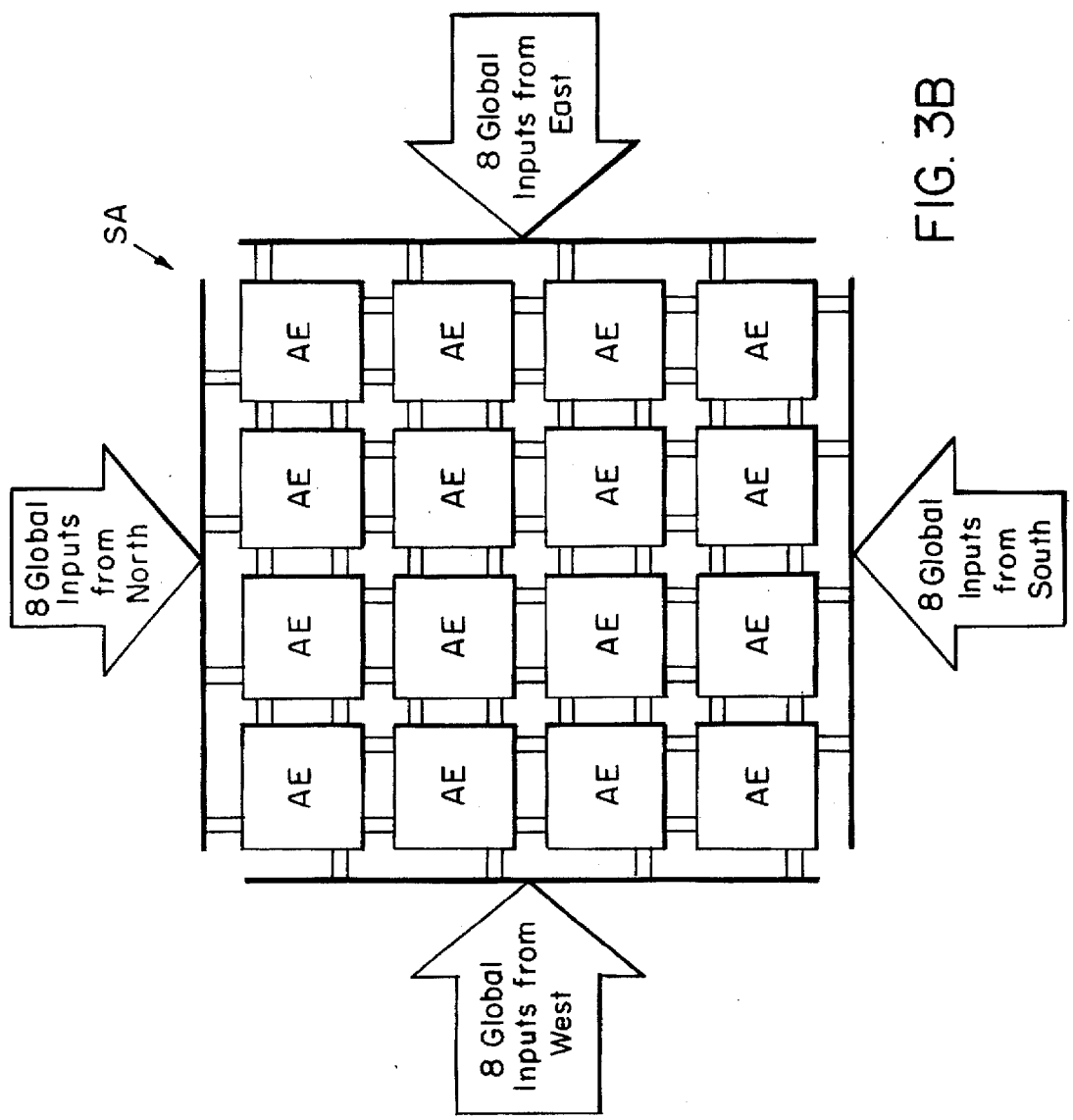
FIG. 3B is a block diagram showing the interconnect for distributing global inputs between the AE's of a subarray SA.

The level-one interconnect provides a balanced fan-in of local and global signals. As schematically illustrated in FIG. 3A, the local interconnect lines 2-8 of FIG. 2B originate from the three vector elements of the same row, right 1, 2, and 3, and three more from the same column: up 1, up 2, up 3. In combination with the one self feed back signal, a total of 7 intra-subarray signals are provided to each AE. As shown in FIG. 3B, incoming global signals global 1-8 of FIG. 2B come from outside the subarray SA from each of the four directions. In total, the level 1 interconnect provides 15 signals to each AE: 7 locals, 8 globals, and 1 self-feedback.

FIG. 1 shows the level-two interconnect. This shared routing network routes logic signals between AE's over lines that are assigned by context programming in response to the broadcast context CID, allowing the same physical line to transmit logic signals from different AE's. Each subarray SA1,1-3,3 shares four bidirectional crossbars CBN, CBE, CBW, CBS. Each of the bidirectional crossbars CB act as a source of the eight input global signals to each subarray and as a selector to transmit eight of the 16 total element output signals generated by that subarray. For example, crossbar CBE provides eight global signals to subarray SA1,1 that originate at subarray SA2, 1. Crossbar CBE also receives the element output signals that are generated by the sixteen array elements AE of subarray SA1,1 and selects one of the sixteen signal to drive into each of the eight lines of the subarray SA2,1.

Figure 4A:
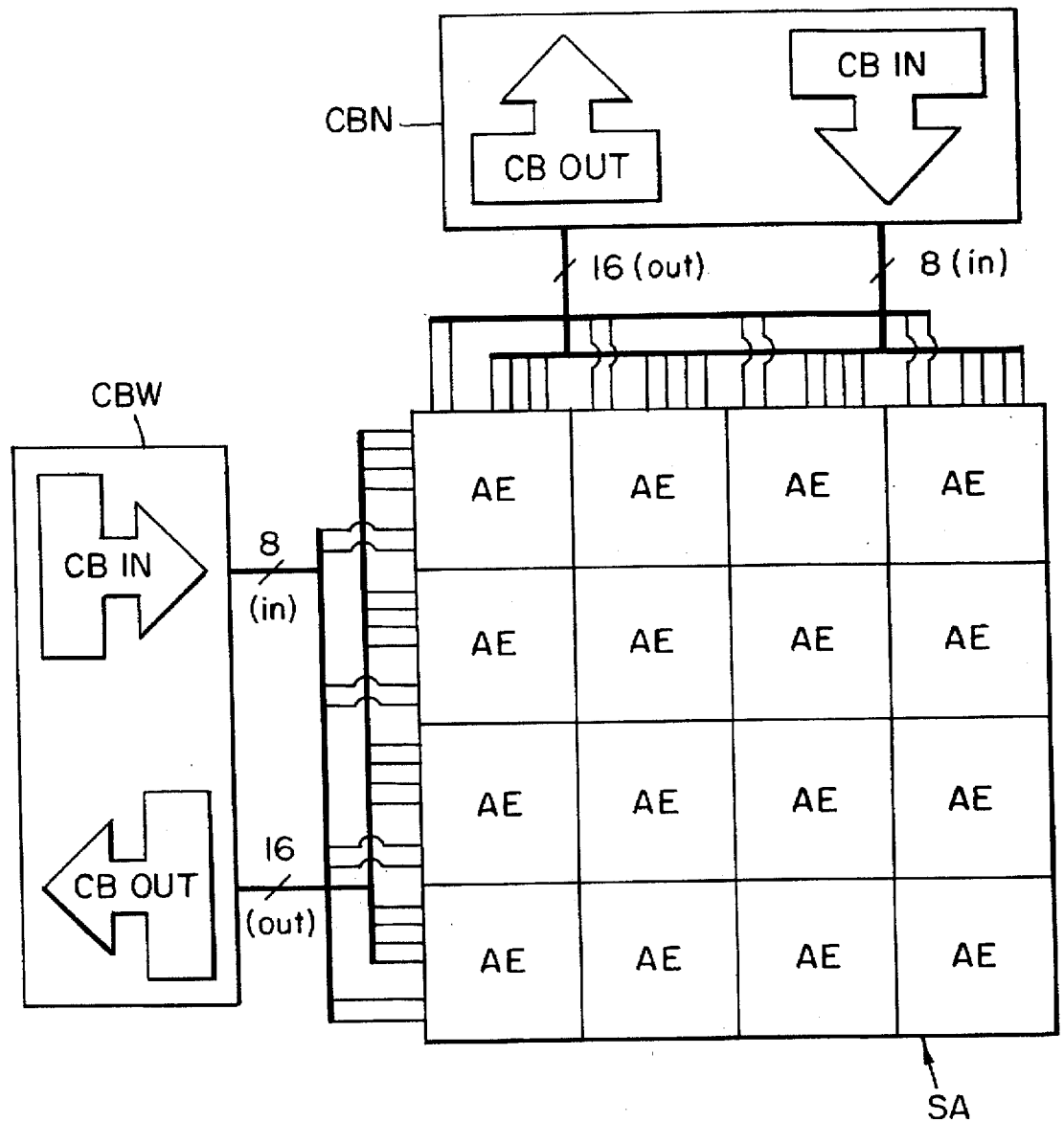
FIG. 4A is a block diagram showing two exemplary bidirectional crossbars CBW, CBN providing the global signals to AE's of a subarray and receiving the sixteen local signals from the AE's for distribution to other subarrays.

FIG. 4A shows two crossbar interconnections for an exemplary one of the subarrays SA extracted from the DPGA 100. Specifically, the bidirectional crossbar CBN, for example, contains two unidirectional input and output crossbars CBOUT, CBIN with respect to that subarray SA. The outgoing crossbar CBOUT picks up the sixteen column local interconnect lines from each of the array elements and selectively provides only eight to an adjoining subarray SA (not shown). In the similar vein, the incoming unidirectional crossbar CBIN selectively provides eight of the sixteen signals from that adjoining subarray as the eight global signals received by the illustrated subarray.

Figure 4B:
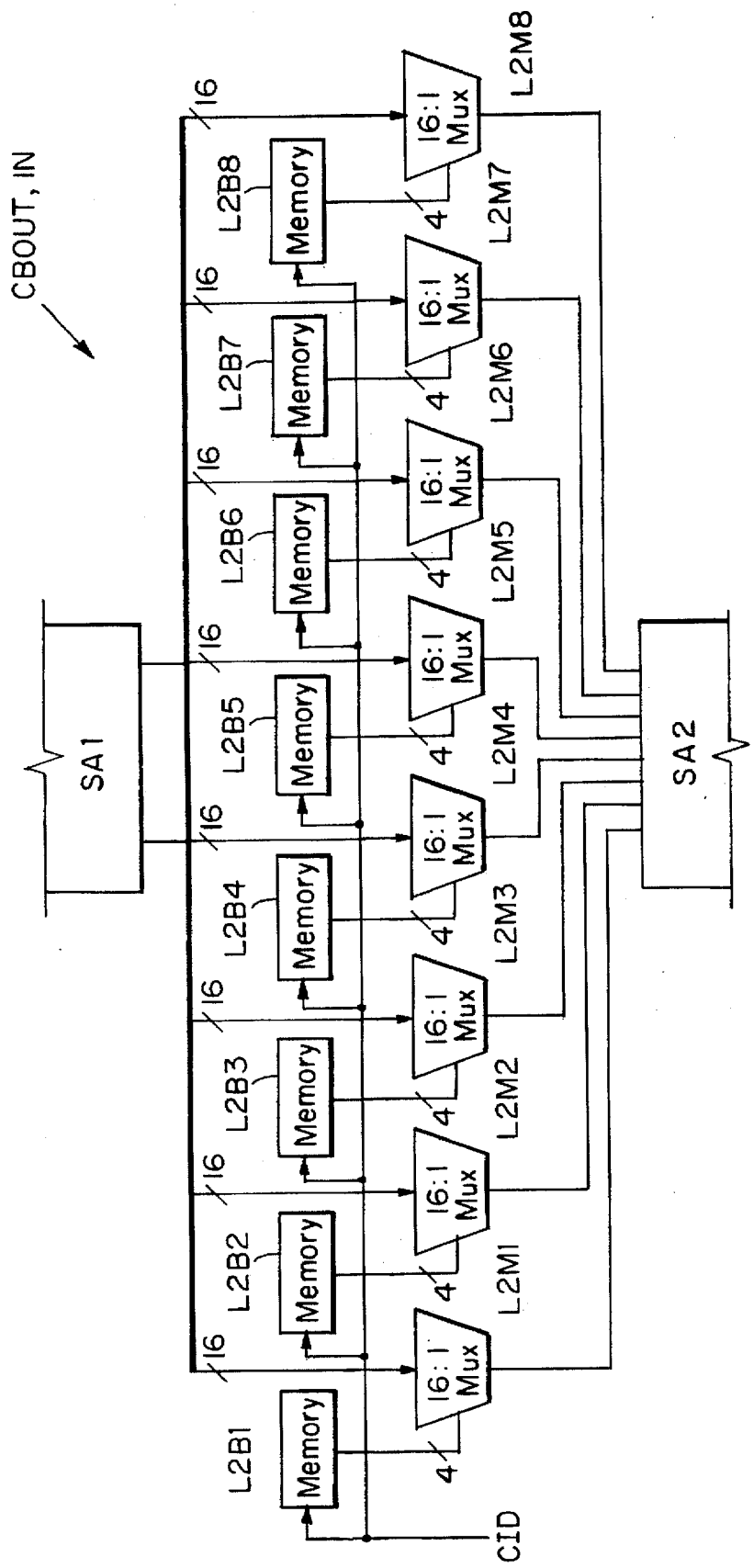
FIG. 4B is a block diagram of the internal architecture of one of the unidirectional crossbars CBIN.

FIG. 4B shows the internal architecture of the unidirectional crossbars CBIN,CBOUT. Here, eight level-two multiplexers L2M1-8 receive the same sixteen local signals from the sending subarray SA1. Each one of these level-two multiplexers selects and transmits one of the signals to the second subarray SA2. The selective transmission of each one of these level-two multiplexers L2M1-8 is controlled by eight level-two memories L2B1-8 that are positioned locally in the crossbar. The level-two memories L2B1-8 are 4 context by 4 bit memories which receive the context identifier CID to selectively enable one of the four context arrays. As a result, different global routing patterns can be provided on every change in the context.

These level-two memories L2B1-8 are constructed as shown in FIGS. 2C-2E. More specifically, as shown in FIG. 2C, the level-two memory L2M1-8 can be implemented in a single 4 context by 32 column memory block 14B. Here, however, four columns are assigned to each of the eight second-level multiplexers. Further, the memory block is dual port as described in reference to FIG. 2D whereby one context can be currently used to control the multiplexers while one of the other 3 dormant contexts can be reprogrammed with new context data. And, as discussed in reference to FIG. 2F, each group of four crossbar memory blocks can share a single decoder.

Figure 5A:
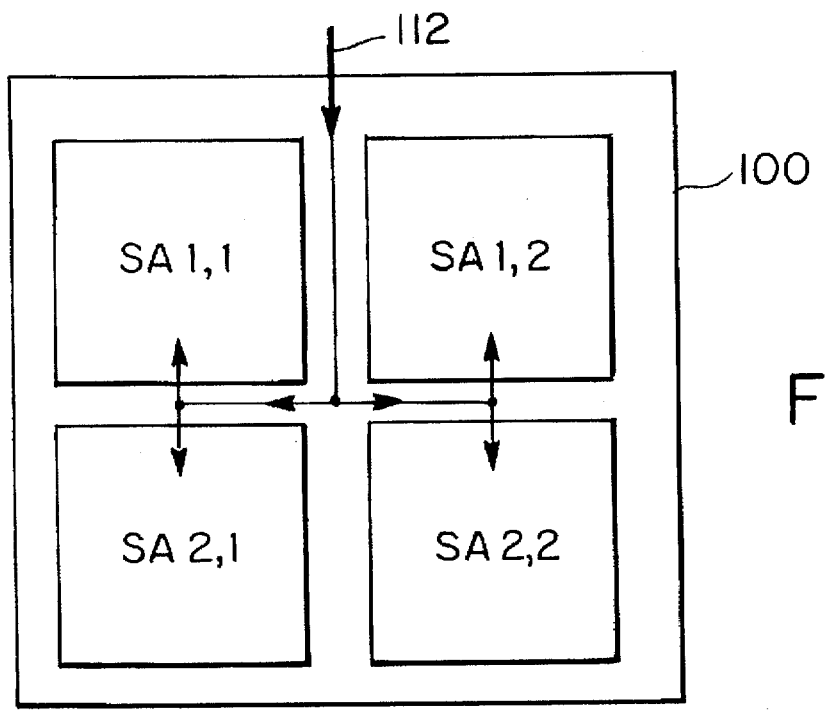
FIG. 5A schematically illustrates the distribution of a context identifier CID, generated off-chip, among subarrays.

The generation and distribution of the context identifier CID can take a number of forms in the present invention. In the simplest implementation, schematically shown in FIG. 5A, the context identifier comes to the DPGA 100 off-chip via a CID pin 112. The signal is amplified by a buffering amplifier 114 and distributed to the four subarrays or quadrants SA1,1-2,2, quadrants representing arrays of subarrays. There, the signal is also locally buffered by registers 116. With in each quadrant the distribution is recursively made.

Figure 5B:
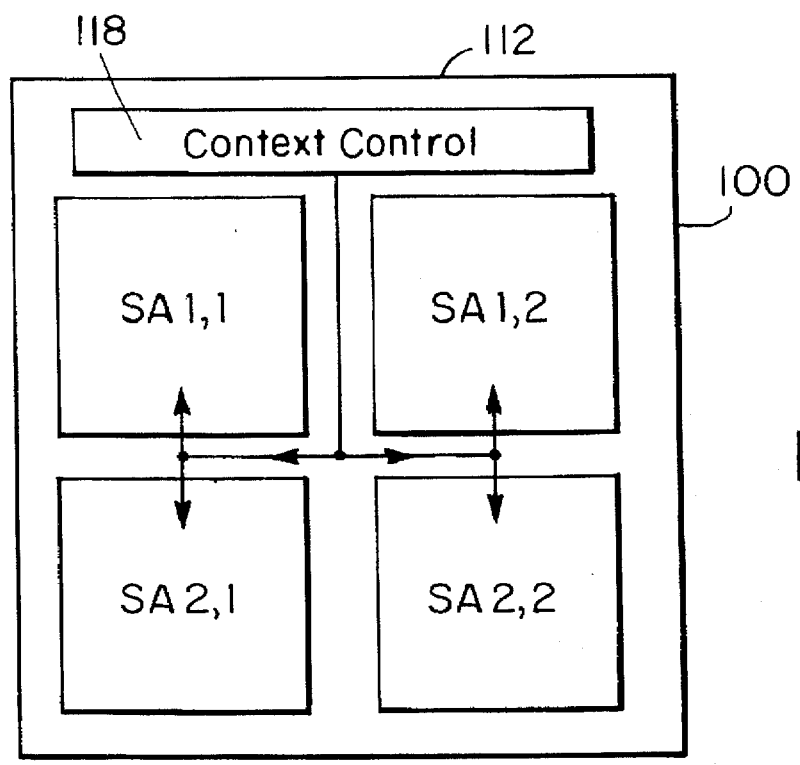
FIG. 5B shows the distribution of an on-chip generated context signal.
Figure 5C:
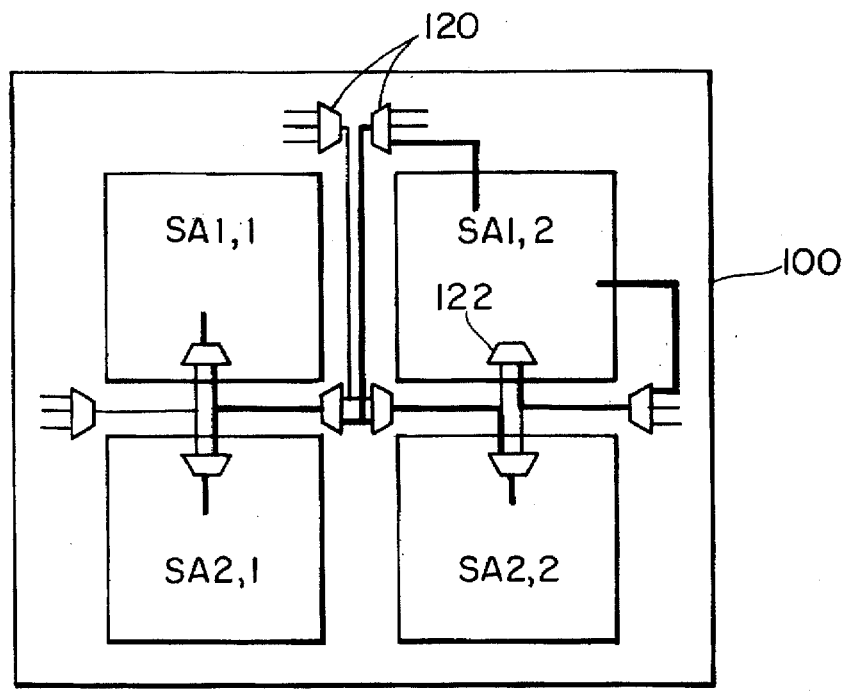
FIG. 5C shows the distribution of an on-chip generated context signal that is generated by a subarray and distributed through combinational and selection logic.

Referring to FIG. 5B, the CID can alternatively be generated on the DPGA 100 in a context control section 118. A simple counter can be used to iteratively step through the contexts for the DPGA 100. Alternatively, the context control 118 can be event-driven either off- or on-chip. For example, the CID can be chosen by logically combining inputs to the DPGA or selected in response to current computations being carried out by the chip. As shown in FIG. 5C, the context control can be implemented in one of the subarrays, here SA2,1 to control the context selection for the entire chip. Multiplexers 120 are used to determine the subarray that generates the CID and intra-subarray multiplexers 122 enable the subarrays to select the source of the CID.

The context distribution can be purely combinational from the context source or may be pipelined. The context distribution can entail a large delay especially when the context source is off-chip. Without pipelining, the time for context distribution will add to cycle time. By adding pipeline registers on the distribution path, this distribution time need not limit clock frequency of the array operation. In general, pipeline registers would be added at selective fan-out points, e.g., pipeline registers might be added at every second or fourth fan-out buffer point.

The above-described FPGA-SIMD hybrid architecture increases flexibility for both implementation and application of computational arrays. Several benefits can be immediately identified with regard to DPGA architecture over either SIMD arrays or FPGAs.

The width of the CID field is much shorter than the stored instruction. Since instruction distribution bandwidth is a major design constraint in high performance SIMD arrays, this reduction is very important. For example, a complex FPGA cell might provide five input logic functions. Distributing a truth table for such a function requires 32 instruction bits; a CID as small as 8 bits might suffice for most applications, reducing the required instruction bandwidth by a factor of four. This is not so say that the inventive DPGA does not need to load the context programming. As in conventional FPGA's, this usually happens during a relatively slow programming phase. In fact in the present invention, this phase may take longer since the multiple contexts are loaded. The advantage comes during operation, when the DPGA can quickly shift between contexts—whereas an FPGA would require new programming.

Boundary conditions are a common case where non-uniform data handling is required. In the DPGA model, boundaries are programmed to perform a different set of operations from interior elements during some computations. One particularly compelling example of such boundary processing is the use of a DPGA array for bit-parallel arithmetic operations, where the most and least significant bits of each parallel data word usually require special handling. Traditionally, SIMD's experience difficulty when the pieces of the data in the array must be operated on differently or there is insufficient data parallelism to occupy the entire array performing the same computation on an operation cycle.

In computation viewed from a traditional FPGA, the present invention adds the configuration cache and the ability to perform zero-latency reconfiguration between cached configurations. Computations are performed in time-slices achieving much more efficient utilization of AEs. In conventional FPGAs, most AEs are exercised at full operational speed for only a small portion of the clock cycle. That is, each AE is part of some path between sequential elements which are clocked at the component's system clock rate. Assuming there are n AEs in the critical path between sequential elements for a computation and each AE can operate in time $t_{op}$, the system clock cycles is at least $n \cdot t_{op}$.

A given AE only performs its function during 1/n of the cycle and spends the rest of the time holding its value. By pipelining and time-slicing, or distributing across clock cycles, the computation, each AE performs its computation at the correct time to produce the desired result without increasing the overall latency of computation. Each of the AEs is now available on the remaining (n−1) time slices to perform other operations. Consequently, other operations can now be scheduled on each AE during these unused cycles. Computations are interleaved, effectively extracting higher throughput from an array of a given size. In practice, each pipeline register introduces some timing overhead. If $t_{reg}$ is the overhead of the pipeline register, then the entire computation requires $n \cdot (t_{op} + t_{reg})$. If $t_{op} \gg t_{reg}$, then the overhead is small and often worth paying to increase throughput. If $t_{reg}$ is larger, it often still makes sense to pipeline but at a larger granularity. In general, the n-element critical path is divided into m-segments and pipeline boundaries placed only between the segments. The computation is slowed down as shown in Equation 2.

$$t_{pipelined} = t_{nonpipelined} + \Delta \, t_{latency} \tag{3}$$

$$\Delta \, t_{latency} = \left(\frac{n}{m}\right) t_{reg}$$

But, an additional throughput is provided as shown in Equation 3.

$$\frac{\text{Pipelined}}{\text{Throughput}} = \left(\frac{n}{m} - 1\right) \frac{\text{Original}}{\text{Throughput}} \tag{4}$$

The DPGA can also be viewed as having many virtual cells per physical AE. At a given point in time one function is active at each AE. Using the CID, the personality of each AE can be switched among the virtual cells it is emulating. This allows a small DPGA array to efficiently emulate a larger FPGA array.

The virtual cells approach can also be viewed as a technique for reducing the system part count. Rather than collect enough FPGA components to spatially implement all the functions required at any point in time, a single DPGA is employed with an external memory or ROM chip to store additional contexts. A controller inside the DPGA can then switch between configurations sequentially to perform the complete ensemble of required functions.

The logical extension of this integration process is to implement the DPGA in a high-density DRAM process and therefore integrate the programmable logic with a memory store. The combined chip is able to perform also any logic operation, with a slowdown increasing with operation complexity. FPGAs are in common use today for logic emulation. Most emulation systems directly map gates in the emulated system to gates in the FPGA. This uses the FPGA AEs inefficiently. The hybrid AEs can be used more efficiently by scheduling multiple gates in the emulated system to a single gate on the FPGA and using time-slice computation as above. The CID also provides the opportunity to perform Event-Driven Simulation. Like software oriented event-driven simulation, some subsets of the system change infrequently. Using the virtual cells mode, "swap" are made in a region of logic and emulate the region only when its value changes.

FPGAs also promise to be useful as tightly coupled co-processors for conventional microprocessors. The FPGA can be configured to perform some application-specific calculations more quickly than the processor. With the internal configuration cache, the DPGA array can switch between operations rapidly. This has two benefits. first, the array can support multiple configurations for a single computation thread. Second, configuration contexts allow DPGA co-processors to support multiple threads. This capability will become more important for fine-grained, multithreaded microprocessors which support fast context switching.

Turning now to some specific implementation issues, because the number of signal lines needed decreases over the length of the column, wires can become thinner from top to bottom. In another layout issue, a pair of columns is interlocked by rotating one 180 degrees and placing them such that their edges line up zipper-style. The remaining decode logic for each column (inverters and NANDs) is bundled at the corresponding end of the column pair, and laid out such that it smoothed out the rough edge created by the abutted columns. Four of these column pairs are then abutted to produce the complete decode and pass gate grid for the crossbar.

Synchronization and control at the chip level seems deceptively simple but actually involves a great deal of layout and wiring complexity at the floor plan level. For simplicity, all signals in and out of the chip are synchronized to decouple the pad delays from the system critical paths. Control signals are clocked and buffered at the pads and then distributed out across the chip. Programming lines are bi-directional, buffered by a top level pre-pad bi-directional buffer. A reset signal isolates the programmable I/O pins from the external system. This is necessary in order to prevent driving unpredictable and hazard signals during power-up.

Power and ground are provided to the array via pairs of 20 μm wires carry enough current for at most one subarray. The IR drop along these wires is less than 0.3V (by conservative, but approximate calculations) under worst case conditions. The subarray then draws power from these lines into a smaller grained grid across the array elements. The crossbars operate under a similar scheme. All other logic draws power from properly sized power rails.

To minimize clock skew, the clock drivers are carefully guided to even out current draw. Clock originates from the bottom of the chip, distributes through the channels between subarrays, and then drives out via four blocks of large tank buffers onto a clock grid which goes across the entire chip. Clock lines are 6 μm wide for global wires and 2 μm for local wires (where possible). This provides a reasonable tradeoff between IR noise and capacitive loading. The clock drives off the chip to form an external phase locked loop (PLL). The PLL is implemented on chip given the traditional complexity of such designs. To amortize out the pad and package delay, a loopback path locks the signals as closely as possible.

Figure 6A:
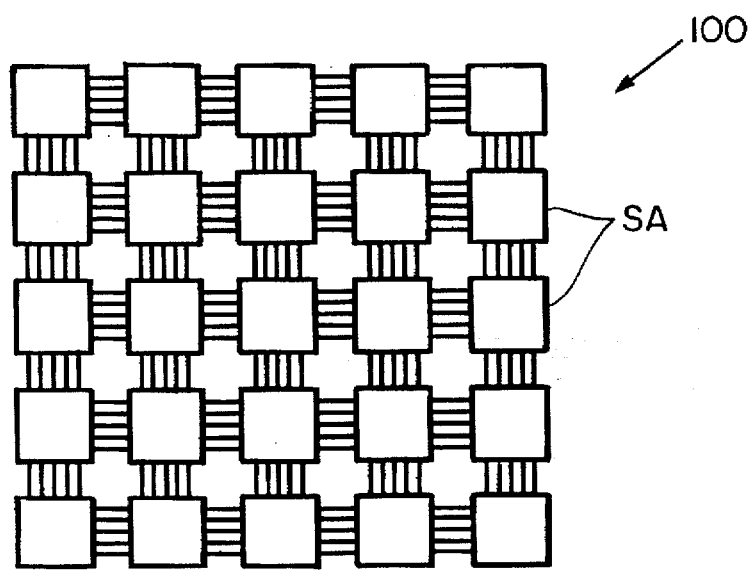
FIG. 6A schematically shows a nearest neighbor interconnect for subarrays according to an alternative embodiment.

Above, a specific example of the interconnect was developed. Other alternative arrangements are, of course, possible. To discuss a few examples, the level-two interconnect could be implemented as a nearest neighbor or mesh type connection system shown in FIG. 6A. By limiting all connections to fixed distances, the link delay does not grow as the array grows. Further, the bisection bandwidth in a mesh configuration is a function of √in and hence never dominates the local array element size. Communicating a piece of data, however, between two points in the array requires a switching delay proportional to the distance between the source and the destination. Since the switching delay through the programmable interconnect is generally much larger than fan-out or wire propagation delay along a fixed wire, this makes distant communication slow and expensive. For example, in a topology where direct connections are only made between an array element and its north, east, south and west neighbors (NEWS network) a signal must traverse the number of programmable switching elements proportional to the mean distance between the source and the destination. For interconnect network topologies typically encountered in logic circuits, this can make interconnect delay quite high—easily dominating the delay through the array element logic.

While the nearest neighbor interconnect is minimally efficient in the preferred embodiment shown in FIG. 1, for the 3×3 array elements in the subarrays, a larger array should include a richer interconnection scheme among subarrays to avoid incurring a large switching delay when routing between distant subarrays.

Generally, a number of design requirements can be derived for an interconnect for the present invention. First, the network must be capable of implementing the interconnection topology required by the programmed logic network with acceptable interconnect delays. Also, space required for the configuration memory can account for a reasonable fraction of the array real-estate. Configuration bits should be used efficiently. Additionally, wire topology should be chosen to balance interconnect bandwidth with array size so that neither strictly dominates the other. Finally, delay should be minimized both in the propagation and fan out delay and the switched element delay.

On the scale of the level-one interconnect, some of the viable interconnection schemes include nearest neighbor which is implemented in the preferred embodiment of FIG. 1, regular neighborhood, bounded sub-arrays as implemented in the preferred embodiment and crossbars.

Figure 6B:
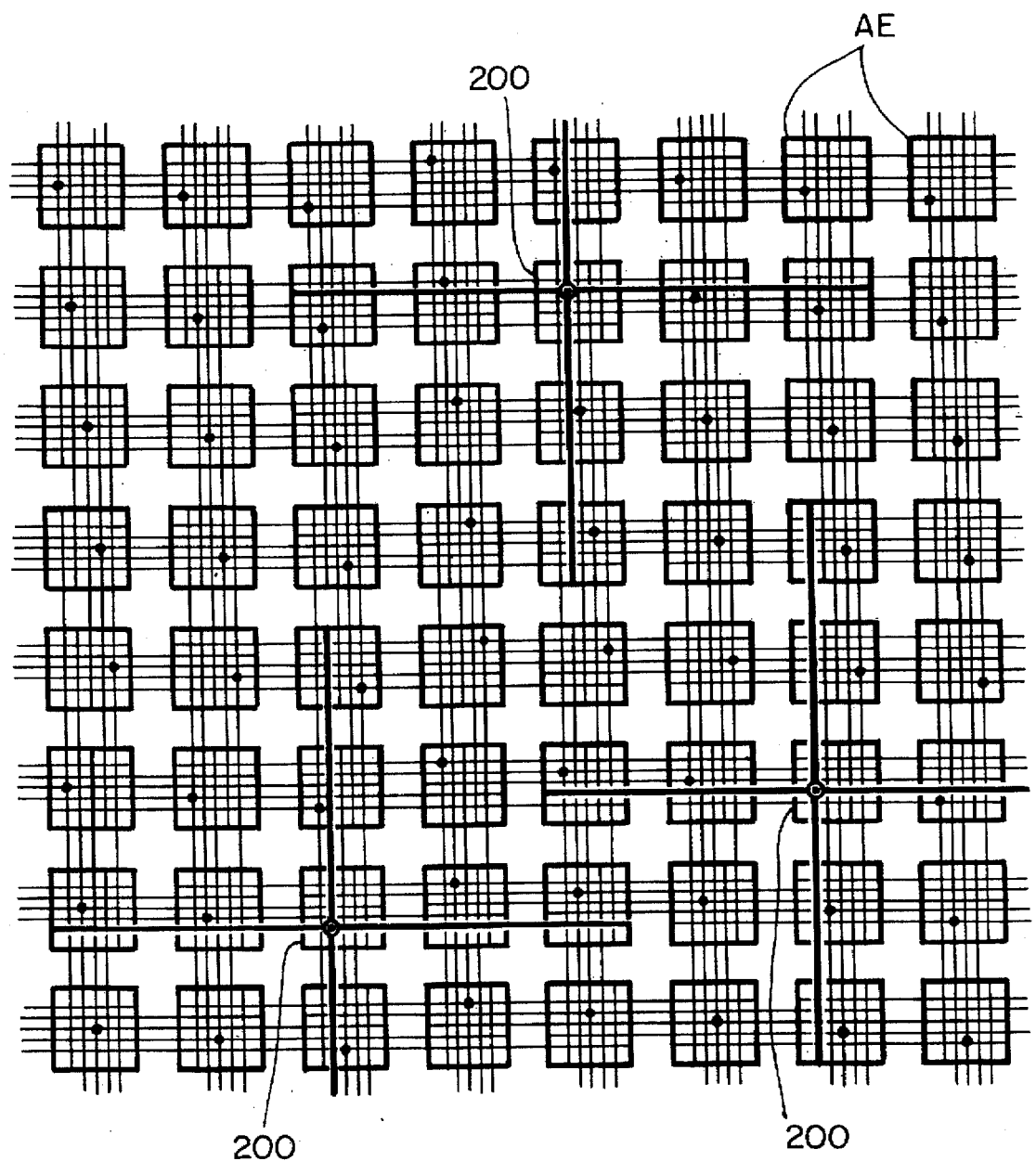
FIG. 6B shows a local neighborhood interconnect according to another embodiment.

FIG. 6B shows an example of a regular neighborhood local interconnect. In this example, every array element AE fans out directly to its nearest neighbors in each major compass directions. One array element 200 output is shown highlighted. The dots indicate the source of a pair of wires. Wires which do not cross at a dot are not connected. In this scheme, each AE has nine local inputs: one for itself, one from each neighbor in the direct North, South, East, and West, and one from each array element, two elements over in the array in each compass direction.

Figure 6C:
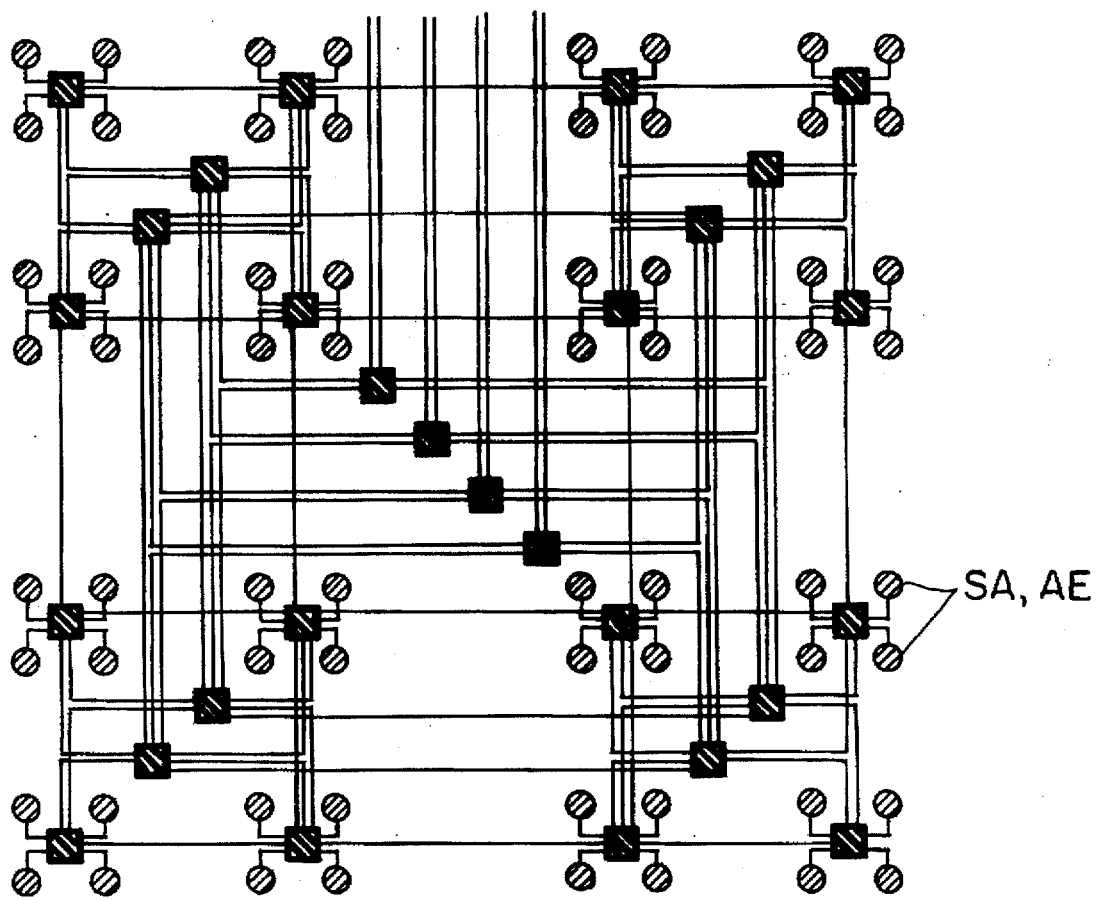
FIG. 6C schematically shows a fat-pyramid interconnect for subarrays or array elements in still another embodiment.

Referring to FIG. 6C, the illustrated fat-pyramid interconnect is another alternative. This topology combines the nearest neighbor connections of the mesh with the more crossbar-like interconnect which gives the fat-tree topology. This interconnect can be applied to either transmit signals between subarrays SA or array elements AE.

Since switching delays in the chosen interconnect may be comparable to logic delays, it will often make sense to pipeline the transmission of data through long interconnect segments. In particular, it may be useful to use the array element logic plus local interconnect delay as a base cycle time. When connections need to traverse additional, hierarchial interconnect, this will entail large delays. By pipelining across the interconnect, operation at the base cycle time is possible despite large latency in the interconnect. Here it would make sense to group a large number of switching stages together, when the delay is comparable to the array element logic plus local interconnect delay, and treat each such group as a separate pipeline stage. Programmable or mandatory flip/flops associated with the switching network would be needed to support the pipeline interconnect discipline.

In the present invention, since multiple context configurations are included to switch the interconnect, each piece of the interconnect can be time-multiplexed. This feature works especially well with the pipeline interconnect. Cycled at the base cycle time, the interconnect can pipeline multiple bits of data potentially destined for different destinations, across any individual wire during the switching latency required to get a bit between distance portions of the device. This time-multiplexed wire use allows one to extract full bandwidth of the wires on the programmable device and this allows one to extract full bandwidth of the wires on the programmable device and this allows much higher utilization than when a single signal is statically associated with each wire in the programmable interconnect.

Since the delay, density, and area constraints associated with off-chip interconnect is substantially different from on-chip interconnect, i.e., it is much slower, less dense and larger, it often makes sense to handle device input/output especially in the network. To avoid periphery pin limitations, it may make sense to drive inputs directly into higher level, long-spanning interconnect in the array rather than simply into peripheral nearest neighbor connections. Similarly, output connections may want to come from higher, courser levels in the hierarchial interconnect rather than from local interconnect. Further, techniques for time, multiplexing in the input/output pins to maximize their bandwidth are generally beneficial.

While this invention has been particularly shown and describe with references to preferred embodiments thereof, it will be understood by those skilled in the art that various changes in form and details as in context memories, network switching and AE, gate configurations may be made therein without departing from the spirit and scope of the invention as defined by the appended claims.

We claim:

1. An integrated dynamically programmable logic array, comprising:
    at least a two dimensional array of programmable logic elements, each one of the logic elements receiving plural input logic signals from plural other logic elements and including locally stored multiple contexts dictating different combinatorial logic operations performed by the logic elements; and
    a context signal source that provides a context signal, indicating an active one of the contexts, commonly to the programmable logic elements of the array; and
    wherein the contexts for each one of the logic elements are individually accessible so that a new context can be loaded into the logic elements while another context is controlling logic operations of the logic elements.

2. A programmable logic array as described in claim 1, wherein the context signal source provides the context signal up to every cycle of the programmable logic array.

3. A programmable logic array as described in claim 1, wherein the context signal source generates plural context signals that dictate contexts for regions of the array of the logic elements.

4. A programmable logic array as described in claim 1, wherein each one of the logic elements receives at least four input logic signals from other logic elements of the array and generates at least one output logic signal in response to the input logic signals.

5. A programmable logic array as described in claim 1, further comprising a logic element interconnect for transmitting logic signals between logic elements.

6. A programmable logic array as described in claim 5, wherein the interconnect includes stored multiple contexts for dictating routing of the logic signals between the logic elements.

7. A programmable logic array as described in claim 6, wherein the contexts for the interconnect are individually accessible so that a new context can be stored into the interconnect while another context is controlling a routing operation performed by the interconnect.

8. A programmable logic array as described in claim 6, wherein the interconnect comprises a crossbar-type interconnect.

9. A programmable logic array as described in claim 1, wherein the logic elements are adaptable to enable transmission of logic signals directly between logic elements without intervening latching.

10. A programmable logic array as described in claim 1, wherein the logic elements are programmable gates.

11. A programmable logic array as described in claim 1, further comprising a multilevel logic element interconnect that transmits logic signals between logic elements.

12. A programmable logic array as described in claim 11, wherein the interconnect includes stored multiple contexts that dictate routing of the logic signals between the logic elements.

13. A programmable logic array as described in claim 12, wherein the context information is stored in memories distributed throughout the interconnect.

14. A programmable logic array as described in claim 11, wherein the interconnect comprises a level-one interconnect that transmits logic signals between near-neighborhood logic elements.

15. A programmable logic array as described in claim 14, wherein the interconnect further comprises a level-two interconnect that transmits logic signals between subarrays of the logic elements.

16. A programmable logic array as described in claim 14, wherein the level one interconnect further transmits logic signals globally across the array.

17. A programmable logic array as described in claim 6, wherein the contexts of the interconnect are stored in context memory vectors holding encoded states for switching elements of the interconnect.

18. An integrated dynamically programmable logic array, comprising:
    at least a two dimensional array of programmable logic elements, each one of the logic elements receiving plural input logic signals from plural other logic elements and including locally stored multiple contexts dictating different combinatorial logic operations performed by the logic elements; and
    a context signal source that provides a context signal, indicating an active one of the contexts, commonly to the programmable logic elements of the array; and
    wherein the contexts for the logic elements are stored in separately addressable context memory vectors holding truth tables for the combinatorial logic operations so that a new truth table is storable in a first one of the context memory vectors while a truth table of a second one of the context memory vectors is dictating the logic operations performed by the logic elements.

19. An integrated dynamically programmable gate array, comprising:
    a two dimensional array of programmable gates, each one of the gates including:
    at least two separately addressable and programmable memories for storing truth tables of different contexts corresponding to different combinatorial logic operations;
    a memory selector for activating one of truth tables in response to a context signal;
    a multiplexer generating an output logic signal by addressing the activated memory in response to input logic signals from other gates in the two dimensional array; and a gate interconnect for transmitting the output logic signals received from the gates of the array as the input logic signals to the gates of the array; and a context selector for generating the context signal commonly received by the gates of the array.

20. A method for operating an integrated dynamically programmable gate array including a two dimensional array of programmable gates, the method comprising:

providing each one of the gates with plural input logic signals from plural other gates;

locally storing multiple contexts at the gates;

performing different combinatorial logic operations with the gates by accessing the multiple contexts;

providing a context signal indicating an active one of the contexts, the active context dictating the logic operation of the gates;

commonly providing the context signal to the programmable gates of the arrays individually accessing the contexts; and loading new contexts into the programmable gates while other contexts are controlling logic operations of the gates.

21. A method as described in claim 20, further comprising generating a new context signal in response to a clock signal.

22. A method as described in claim 20, further comprising providing a multilevel logic element interconnect that transmits logic signals between the programmable gates.

23. A method as described in claim 22, further comprising storing multiple contexts that dictate routing of the logic signals between the programmable gates.

24. A method as described in claim 22, further comprising storing the context information in memories distributed throughout the interconnect.

25. A method as described in claim 22, further comprising providing a level-one interconnect that transmits logic signals between near-neighborhood programmable gates.

26. A method as described in claim 25, further comprising providing a level-two interconnect that transmits logic signals between subarrays of the programmable gates.

27. A method as described in claim 25, further comprising the level-one interconnect transmitting logic signals globally across the array.

28. A method as described in claim 20, further comprising:

controlling the routing of logic signals between the programmable gates over an interconnect in response to the context signal; and storing contexts of the interconnect in context memory vectors holding encoded states for switching elements of the interconnect.

* * * * *